(12) United States Patent
Theuss et al.

(10) Patent No.: US 8,106,654 B2
(45) Date of Patent: Jan. 31, 2012

(54) MAGNETIC SENSOR INTEGRATED CIRCUIT DEVICE AND METHOD

(75) Inventors: Horst Theuss, Wenzenbach (DE); Helmut Wietschorke, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 726 days.

(21) Appl. No.: 12/127,510

(22) Filed: May 27, 2008

(65) Prior Publication Data

US 2009/0295381 A1    Dec. 3, 2009

(51) Int. Cl.
*G01R 33/02* (2006.01)
*G01R 33/06* (2006.01)

(52) U.S. Cl. ............ 324/252; 324/207.21; 324/207.22; 324/207.26; 257/48; 257/E21.002; 360/313; 438/15

(58) Field of Classification Search .......... 324/252, 324/207.11–207.26; 338/32 R; 360/313
See application file for complete search history.

(56) References Cited

U.S. PATENT DOCUMENTS

| | | | | |
|---|---|---|---|---|
| 4,188,605 | A * | 2/1980 | Stout | 338/32 H |
| 5,206,590 | A * | 4/1993 | Dieny et al. | 324/252 |
| 6,107,793 | A | 8/2000 | Yokotani et al. | |
| 7,112,955 | B2 | 9/2006 | Buchhold | |
| 7,268,543 | B2 | 9/2007 | Pullini et al. | |
| 2006/0226827 | A1 * | 10/2006 | Pannetier et al. | 324/127 |
| 2007/0145972 | A1 * | 6/2007 | Auburger et al. | 324/252 |
| 2009/0140725 | A1 * | 6/2009 | Ausserlechner | 324/207.2 |
| 2009/0243594 | A1 * | 10/2009 | Kahlman | 324/202 |

FOREIGN PATENT DOCUMENTS

| | | |
|---|---|---|
| DE | 3850463 | 10/1994 |
| DE | 10141371 | 3/2003 |
| DE | 102004063539 | 9/2005 |
| DE | 60207560 | 8/2006 |
| EP | 357200 | 7/1990 |

* cited by examiner

*Primary Examiner* — Huy Q Phan
*Assistant Examiner* — Emily Chan
(74) *Attorney, Agent, or Firm* — Dicke, Billig & Czaja, PLLC

(57) ABSTRACT

An sensor includes a substrate with a magnetic field sensor mounted on the substrate. The magnetic field sensor has a first surface defining a plane. A magnetic flux conducting member has a second surface that is not parallel to the first surface. A non-magnetic member is situated between the magnetic field sensor and the magnetic flux conducting member.

22 Claims, 4 Drawing Sheets

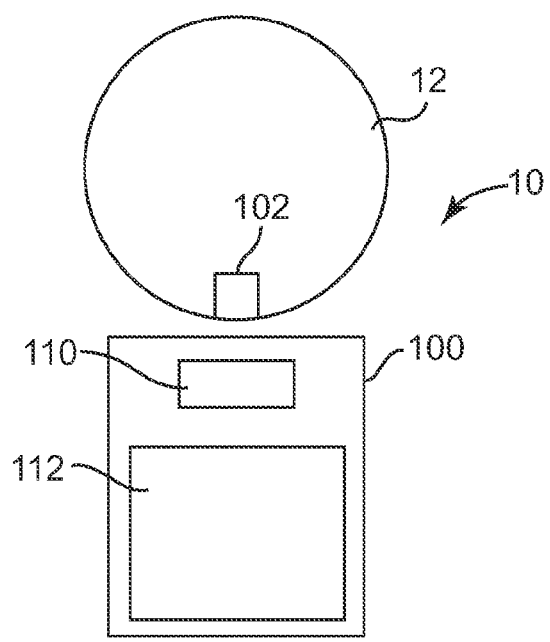
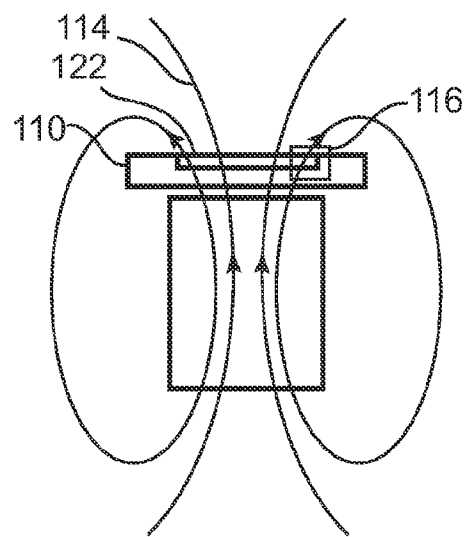

MAGNETIC SENSOR INTEGRATED CIRCUIT DEVICE AND METHOD

BACKGROUND

Magnetic sensing devices, such as Hall sensors or Giant magnetoresistance (GMR) sensors are used in a variety of applications. For example, such magnetic sensing devices are used for sensing the location of a rotating member such as a rotating shaft. A magnet is mounted to rotate with a shaft, and a magnetic sensor is situated to sense the magnetic field of the rotating magnet when it comes in proximity to the sensor.

The magnetic sensing devices include a permanent magnet that functions as a biasing magnet. Since some sensors, such as GMR sensors, are extremely sensitive it is desirable to arrange the sensed magnet such that the magnetic field lines are very precisely situated relative to the sensor. If the sensor is not accurately positioned, for example, due to manufacturing variances, this can cause variation in the magnetic field lines resulting in inaccurate results from the sensor. Attempted solutions for aligning the field lines include special shaping of the biasing permanent magnet. However, modifying the shape of the biasing magnet can be difficult and expensive.

For these and other reasons, there is a need for the present invention.

SUMMARY

A sensor device and a method of making the same are disclosed. The device includes a substrate with a magnetic field sensor mounted on the substrate. The magnetic field sensor has a first surface defining a plane. A magnetic flux conducting member has a second surface that is not parallel to the first surface. A non-magnetic member is situated between the magnetic field sensor and the magnetic flux conducting member.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 1 is a block diagram conceptually illustrating an embodiment of a position sensor system.

FIG. 2 is a block diagram conceptually illustrating magnetic field lines relative to a sensor.

DETAILED DESCRIPTION

Figure 3A:
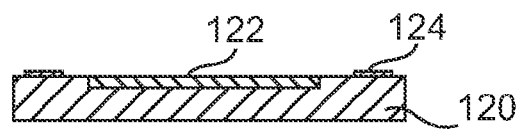
FIGS. 3A-3E are section views illustrating portions of an embodiment of a magnetic field sensor and a process for assembly.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 is a block diagram conceptually illustrating aspects of a sensor system in accordance with embodiments of the present invention. In some implementations, the sensor is used to sense the direction of a magnetic field rather the field strength. Example applications include wheel speed sensors and position sensors. The illustrated sensor 10 includes a magnetic field sensing system 100 that senses the position of a moving member, such as a rotating member 12, thus providing information about the rotation of the member 12 itself.

The magnetic field sensing system 100 includes a magnetic field sensor 110, such as a GMR sensor, which is typically implemented in an integrated circuit. A permanent magnet 112 functions as a biasing magnet for applying a biasing magnetic field to the magnetic field sensor 110. The magnetic field sensor 110 includes a magnetoresistance pattern formed on a sensing surface 122 of the sensor 110. The rotatable member 12 is formed from a magnetic material or includes a magnetic member having teeth 102 or a magnetic pattern, for example. As the movable member 12 moves relative to the magnetic field sensing system 100, the teeth or pattern 102 interacts with the field created by the biasing magnet 112, causing a change of resistance in the magnetic field sensor 110.

In the illustrated embodiment, the sensor system 10 measures magnetic field lines that are generally perpendicular to the surface of the sensor 110. As shown in FIG. 2, the biasing magnet 112 is situated relative to the active sensor surface 122 such that the magnetic field lines 114 cross the sensor surface 122 generally perpendicularly. However, there is also a lateral component to the field lines 114. For example, the highlighted portion 116 of the sensor surface 122 illustrates an area where the field lines 114 have a relatively large lateral component. Certain sensors, such as GMR sensors, are very sensitive to this lateral component of the magnetic field lines, and thus, they can result in sensing errors.

FIG. 3 illustrates portions of the magnetic field sensor 110 and a process for assembly. As illustrated in FIG. 3A, the sensor 110 includes a semiconductor die 120 with an integrated circuit having a sensor surface 122. As noted above, in some embodiments a GMR sensor is employed. In such embodiments, the sensor surface 122 includes alternating ferromagnetic and nonmagnetic metal layers. Contacts 124 are provided on the die 120 for connection of the sensor electronics to external package contacts.

Figure 3B:
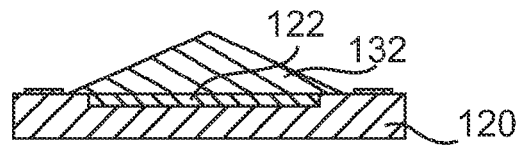
Figure 3C:
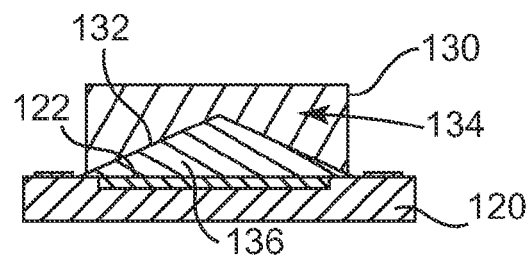

The magnetic field sensor 110 includes a flux distribution device 130 that has two parts in the illustrated embodiment. FIG. 3B illustrates the first part, a nonmagnetic member 132 that is situated on the die 120. The nonmagnetic member 132 can be formed from a mask material or polymer, for example, applied on the wafer-level photo resist. FIG. 3C illustrates the second part of the flux distribution device 130, which is a magnetic flux conducting member 134 made from a soft magnetic material (thus with a small magnetic field strength and high permeability, for example >10$^{-3}$) such as soft iron, Ni, NiFe, FeSiB, etc. The nonmagnetic member 132 provides support for the soft magnetic member 134.

The sensor surface 122 generally defines a plane. As shown in FIG. 3, the magnetic flux conducting member 134 of the flux distribution device 130 has at least one surface 136 that is not parallel to the plane of the sensor surface 122. In other words, the flux conducting member 134 includes a non-planar surface 136. The nonmagnetic member 132 includes a surface that is complementary to the non-planar surface 136. In the embodiment illustrated in the side views of FIG. 3, the non-planar surface 136 is an inverted "V" shape, such that the illustrated flux conducting member 134 is generally triangle-shaped. In other embodiments, the non-planar surface 136 can be curved, dome or cone shaped, etc. FIG. 4 illustrates a magnetic flux conducting member 134 having a curved surface 136.

Figure 3D:
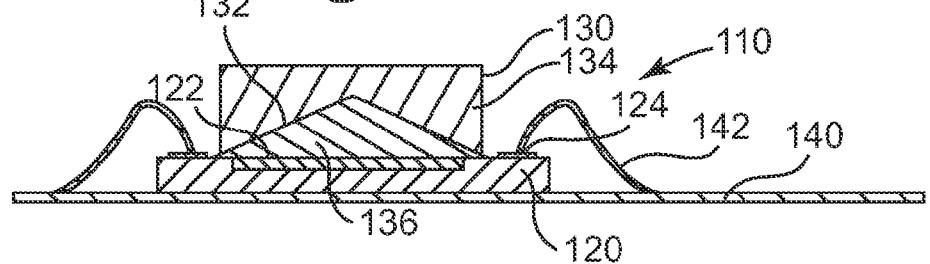
Figure 3E:
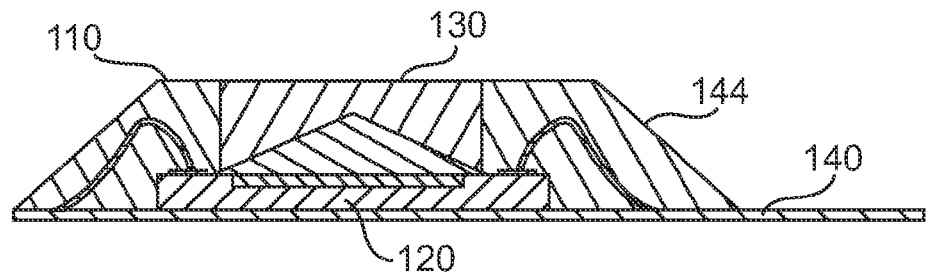
Figure 4:
FIG. 4 illustrates an example of a magnetic flux conducting member.

FIG. 3D illustrates the die 120 mounted on a substrate 140 with bonding wires 142 coupling the contacts 124 to the substrate 140, and FIG. 3E illustrates the magnetic field sensor 110 package encapsulated in a mold compound 144, such as a thermosetting polymer or thermoplastic.

Figure 5:
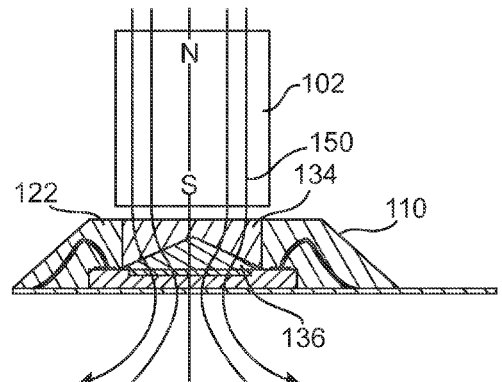
FIG. 5 is a block diagram conceptually illustrating aspects of an embodiment of a position sensor system.

Rather than modifying the shape of the biasing magnet 112, providing the flux distribution device 130 with the soft magnetic flux conducting member 134 alters the field distribution in a desired orientation relative to the sensor surface 122, such that more of the flux field lines are perpendicular to the sensor surface 122. This allows more freedom in positioning the internal biasing magnet 112. FIG. 5 illustrates the biasing magnet 112 situated next to the magnetic field sensor 110, with flux field lines 150 passing through the flux distribution device 130 before reaching the sensor surface 122. The shape of the surface 136 of the soft magnetic flux conducting member 134 guides the flux field lines 150, removing much of the unwanted lateral component of the magnetic field lines.

Figure 6A:
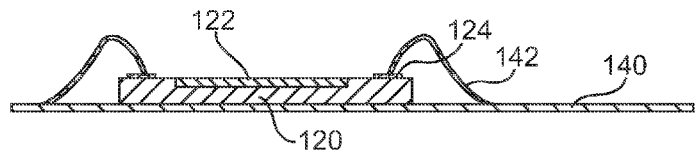
FIGS. 6A-6C illustrate portions of an embodiment of a magnetic field sensor and a process for assembly.
Figure 6B:
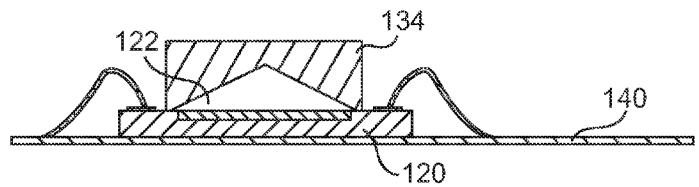
Figure 6C:
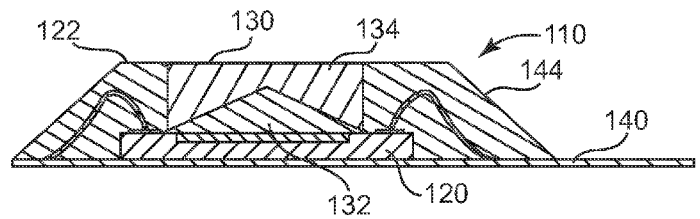

FIG. 6 illustrates an alternative process for assembling the magnetic field sensor 110. In FIG. 6A, the die 120 is mounted to the substrate 140 and wires 142 are connected between the contacts 124 and the substrate 140. In FIG. 6B, the soft magnetic flux conducting member 134 of the flux distribution device 130 is situated over the sensor surface 122, with the non-planar surface 136 forming a cavity between the magnetic flux conducting member 134 and the sensor surface 122. In FIG. 6C, the system 100 is encapsulated in the mold compound 144, for example, by an injection molding process. The non-magnetic mold compound 144 also fills in the cavity beneath the magnetic flux conducting member 134, forming the nonmagnetic member 132 of the flux distribution device 130.

Figure 7:
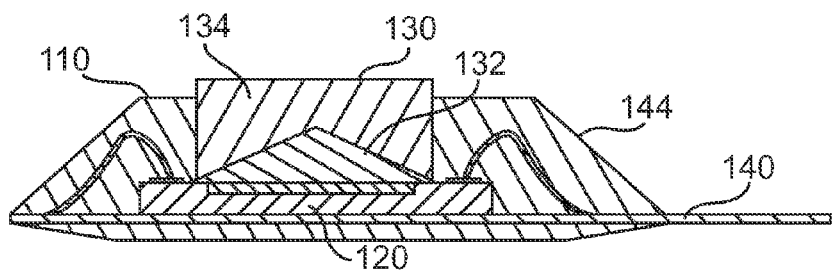
FIG. 7 is a section view of an embodiment of a magnetic field sensor.
Figure 8:
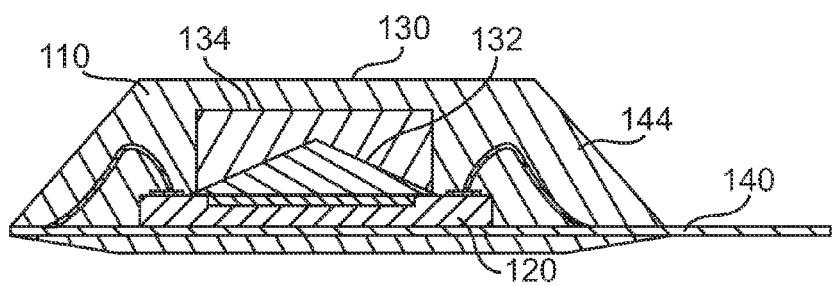
FIG. 8 is a section view of an embodiment of a magnetic field sensor.
Figure 9:
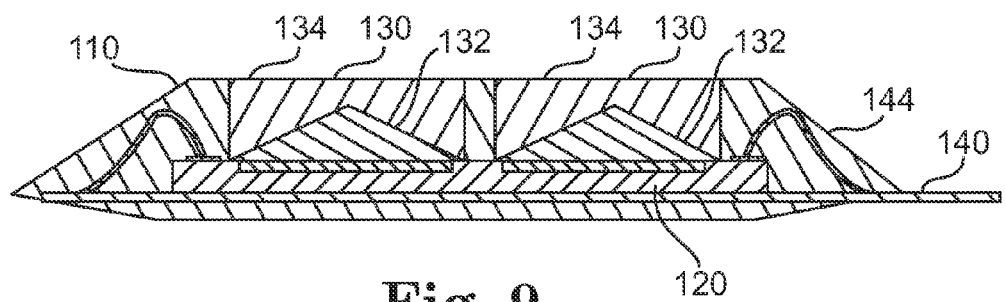
FIG. 9 is a section view of an embodiment of a magnetic field sensor.
Figure 10:
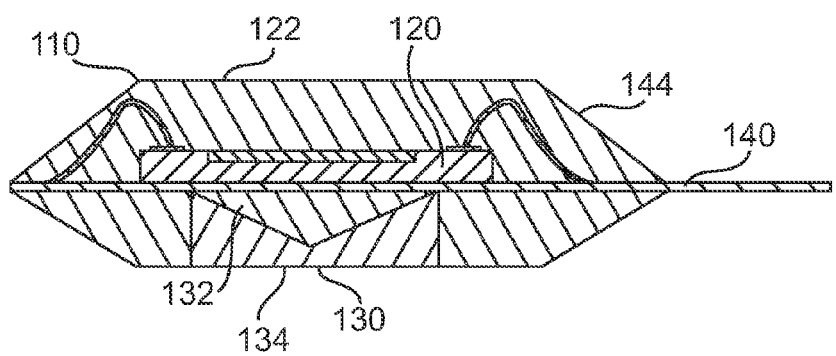
FIG. 10 is a section view of an embodiment of a magnetic field sensor.

FIGS. 7-10 illustrate examples of alternative embodiments. In FIG. 7, the soft magnetic flux conducting member 134 of the flux distribution device 130 extends from the encapsulation 144, and in FIG. 8, the encapsulation 144 extends over an upper surface of the soft magnetic flux conducting member 134 such that it is completely embedded in the encapsulation 144. FIG. 9 illustrates an embodiment in which the semiconductor die 120 includes multiple sensor surfaces 122, with respective flux distribution devices 130, each having soft magnetic flux conducting members 134. In FIG. 10, the flux distribution device 130 is situated below the die 120, wherein the biasing magnet would typically be situated below the die 120 as well.

In each of the examples shown in FIGS. 7-10, the nonmagnetic member 132 of the flux distribution device could be formed during the integrated circuit photolithography process as illustrated in the embodiment of FIG. 3, or it could be formed during the encapsulation process as illustrated in FIG. 6.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A sensor, comprising:
   a substrate;
   a magnetic field sensor mounted to the substrate, the magnetic field sensor having a first surface defining a plane;
   a magnetic flux conducting member having a second surface that is not parallel to the first surface;
   a non-magnetic member situated between the magnetic field sensor and the magnetic flux conducting member;
   wherein the first surface and the second surface define a cavity, and wherein the non-magnetic member is situated in the cavity.

2. The sensor of claim 1, wherein the non-magnetic member has a third surface that is complementary to the second surface.

3. The sensor of claim 1, wherein the magnetic field sensor is a GMR sensor.

4. The sensor of claim 1, wherein the magnetic field sensor and the magnetic flux conducting member are situated on one side of the substrate.

5. The sensor of claim 1, further comprising a mold compound encapsulating the magnetic field sensor, the magnetic flux conducting member, and the non-magnetic member.

6. The sensor of claim 5, wherein the non-magnetic member is formed from the mold compound.

7. The sensor of claim 1, wherein the non-magnetic member is made of a polymer.

8. The sensor of claim 5, wherein a portion of the magnetic flux conducting member extends from the mold compound.

9. The sensor of claim 1, wherein the second surface is non-planar.

10. The sensor of claim 1, wherein the second surface is generally V-shaped.

11. The sensor of claim 1, further comprising a biasing magnet situated proximate the magnetic flux conducting member.

12. The sensor of claim 1, wherein the magnetic field sensor includes first and second magnetic field sensors, each having a first surface defining a plane, and wherein the magnetic flux conducting member includes first and second flux conducting members.

13. The sensor of claim 1, wherein the non-magnetic member is situated between the first surface and the second surface, and the non-magnetic member contacts both the first and second surfaces.

14. The sensor of claim 13, wherein the first surface is a sensing surface of the sensor.

15. A method of making a magnetic sensor system, comprising:
   providing a semiconductor die having a sensor surface with a first surface defining a plane;
   mounting the semiconductor die to a substrate;

situating a magnetic flux conducting member adjacent the semiconductor die, the magnetic flux conducting member having a second surface that is not parallel to the plane; and situating a non-magnetic member between the sensor surface and the magnetic flux conducting member, the non-magnetic member having a third surface that is complementary to the second surface;

wherein the second surface creates a cavity, and wherein the non-magnetic member is formed by filling the cavity with a non-magnetic material.

16. The method of claim 15, wherein the non-magnetic member is formed on the sensor surface, and the magnetic flux conducting member is formed over the non-magnetic member.

17. The method of claim 15, wherein the non-magnetic member is formed on the sensor surface.

18. The method of claim 17, wherein forming the non-magnetic member includes a photolithography process.

19. The method of claim 15, wherein the semiconductor die and the magnetic flux conducting member are on opposite sides of the substrate.

20. The method of claim 15, further comprising encapsulating the magnetic sensor system in a mold compound.

21. The method of claim 20, wherein encapsulating the magnetic sensor system includes leaving a portion of the magnetic flux conducting member extending from the mold compound.

22. The method of claim 15, wherein:

the semiconductor die has first and second sensor surfaces; and first and second magnetic flux conducting members are situated adjacent the first and second sensor surfaces, respectively.

* * * * *